(12) United States Patent
Ogawa et al.

(10) Patent No.: US 9,396,960 B2
(45) Date of Patent: Jul. 19, 2016

(54) PLASMA PROCESSING METHOD AND PLASMA PROCESSING APPARATUS

(71) Applicant: Tokyo Electron Limited, Tokyo (JP)

(72) Inventors: Kazuto Ogawa, Miyagi (JP); Akira Nakagawa, Miyagi (JP); Hideki Konishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/432,541

(22) PCT Filed: Oct. 31, 2013

(86) PCT No.: PCT/JP2013/079520
§ 371 (c)(1),
(2) Date: Mar. 31, 2015

(87) PCT Pub. No.: WO2014/069559
PCT Pub. Date: May 8, 2014

(65) Prior Publication Data
US 2015/0243521 A1     Aug. 27, 2015

Related U.S. Application Data

(60) Provisional application No. 61/725,565, filed on Nov. 13, 2012.

(30) Foreign Application Priority Data

Nov. 1, 2012   (JP) ................................. 2012-241634

(51) Int. Cl.
| | |
|---|---|
| *H01L 21/302* | (2006.01) |
| *H01L 21/311* | (2006.01) |
| *H01J 37/32* | (2006.01) |
| *H01L 21/67* | (2006.01) |
| *H01L 27/115* | (2006.01) |

(52) U.S. Cl.
CPC ..... *H01L 21/31116* (2013.01); *H01J 37/32082* (2013.01); *H01J 37/32091* (2013.01); *H01J37/32568* (2013.01); *H01L 21/31144* (2013.01); *H01L 21/67069* (2013.01); *H01J 2237/334* (2013.01); *H01L 27/11556* (2013.01); *H01L 27/11582* (2013.01)

(58) Field of Classification Search
CPC ..................... H01L 21/3065; H01L 21/31116; H01L 21/31144; H01L 21/67069; H01J 37/32082; H01J 37/32568; B44C 1/22; C23F 1/00; C23F 3/00
USPC ........ 216/68, 70, 79; 438/710, 714, 713, 719, 438/723; 156/345.34, 345.48
See application file for complete search history.

(56) References Cited

U.S. PATENT DOCUMENTS

| | | | |
|---|---|---|---|
| 6,221,784 B1* | 4/2001 | Schmidt ........... | H01L 21/31116 156/345.48 |
| 2006/0154472 A1* | 7/2006 | Kikuchi ........... | H01L 21/31116 438/622 |
| 2007/0251918 A1* | 11/2007 | Bera ..................... | H01J 37/321 216/58 |

FOREIGN PATENT DOCUMENTS

| | | |
|---|---|---|
| JP | 07-263415 A | 10/1995 |
| JP | 2009-266944 A | 11/2009 |
| JP | 2012-195576 A | 10/2012 |

OTHER PUBLICATIONS

International Search Report for PCT/JP2013/079520 dated Feb. 4, 2014.

*Primary Examiner* — Duy Deo
*Assistant Examiner* — Maki Angadi
(74) *Attorney, Agent, or Firm* — Pearne & Gordon LLP

(57) ABSTRACT

A main etching process of forming a recess portion in a multilayer film having a laminated film where a first film and a second film having different relative permitivities are alternately formed on a base silicon film to a preset depth and an over etching process of forming the recess portion until the base silicon film is exposed are performed by introducing a processing gas including a CF-based gas and an oxygen gas and by performing a plasma etching process. In the over etching process, a first over etching process where a flow rate ratio of the oxygen gas to the CF-based gas is increased as compared to the main etching process and a second over etching process where the flow rate ratio of the oxygen gas to the CF-based gas is reduced as compared to the first over etching process are repeatedly performed two or more times.

12 Claims, 13 Drawing Sheets

PLASMA PROCESSING METHOD AND PLASMA PROCESSING APPARATUS

CROSS-REFERENCE TO RELATED APPLICATION

This Application is a U.S. national phase application under 35 U.S.C. §371 of PCT Application No. PCT/JP2013/079520 filed on Oct. 31, 2013, which claims the benefit of Japanese Patent Application No. 2012-241634 filed on Nov. 1, 2012, and U.S. Provisional Application Ser. No. 61/725,565 filed on Nov. 13, 2012, the entire disclosures of which are incorporated herein by reference.

TECHNICAL FIELD

The embodiments described herein pertain generally to a plasma processing method and a plasma processing apparatus of etching a multilayer film formed on a target substrate with plasma.

BACKGROUND

A three-dimensional stacked semiconductor memory such as a 3D-NAND flash memory includes a laminated film including different kinds of layers alternately formed multiple times (see, for example, Patent Document 1). In the laminated film, a recess portion (hole (opening) or a trench (groove)) penetrating to a base film may be formed, and a plasma etching process is performed to form such a deep recess portion.

In the plasma process of etching such a multilayer film, if etching processes are respectively performed on different layers constituting the laminated film, the number of etching processes increases as the number of layers increases, so that a throughput decreases. For this reason, the plasma etching process is performed on the laminated film with a processing gas including all gases respectively required to etch the different kinds of layers, so that a recess portion penetrating through the different layers can be formed by performing the plasma etching at one time.

When the laminated film is etched as such, a mask layer in which an opening of forming the recess portion on the laminated film is patterned is formed on the laminated film and the laminated film is plasma-etched with the mask layer as a mask. To be specific, it is known that a deep hole is formed by performing a main etching process of performing a plasma etching process and then performing an over etching process of widening a shape of a lower end (bottom portion) (bottom CD value) of the deep hole.

Patent Document 1: Japanese Patent Laid-open Publication No. 2009-266944

DISCLOSURE OF THE INVENTION

Problems to be Solved by the Invention

In performing the etching process on the laminated film as such, it is necessary to suppress a width of an opening from being increased when the laminated film is etched in the main etching process, and it is also necessary to suppress a deep hole from being tapered by widening and etching a lower end (bottom portion) (bottom CD value) of the deep hole in the over etching process. If the lower end (bottom portion) of the deep hole is tapered, for example, in a subsequent process, correction cannot be made when performing a vertical Si etching, which may affect electrical characteristics of a device. In order to suppress the lower end (bottom portion) of the deep hole from being tapered, a deposition amount (adhesion amount) of a CF-based polymer needs to be large by reducing a flow rate ratio of an oxygen gas as compared to the other gases in the main etching process, and the deposition amount (adhesion amount) of the CF-based polymer needs to be small by increasing a flow rate ratio of the oxygen gas as compared with the other gases in the over etching process.

Meanwhile, if a time period for the over etching process, in which the deposition amount of the CF-based polymer is small, is increased, the shape of the lower end (bottom portion) of the deep hole can be controlled not to be tapered, but a base loss in which a base silicon layer is deeply etched can occur. On the other hand, if a time period for the main etching process, in which the deposition amount of the CF-based polymer is large, is increased, the etching of the base silicon layer (base loss) can be suppressed, but the shape of the lower end (bottom portion) of the deep hole cannot be sufficiently controlled.

Accordingly, in view of the foregoing, the example embodiments provide a plasma processing method capable of suppressing a base loss while widening a lower end (bottom portion) of a recess portion in plasma-etching a multilayer film.

Means for Solving the Problems

In order to solve the above-described problem, in accordance with one aspect, a plasma processing method performs a plasma etching process on a multilayer film formed on a target substrate arranged in a processing chamber with a patterned mask layer as a mask by generating plasma of a processing gas. Here, the multilayer film includes a laminated film in which a first film and a second film having different relative permitivities are alternately formed on a base silicon film. Furthermore, by introducing the processing gas including a fluorocarbon-based gas and an oxygen gas into the processing chamber to generate the plasma and by performing the plasma etching process, a main etching process of forming a recess portion in the laminated film to a predetermined depth and an over etching process of further forming the recess portion until the base silicon film is exposed are performed. Moreover, in the over etching process, a first over etching process in which a ratio of a flow rate of the oxygen gas to a flow rate of the fluorocarbon-based gas is set to be increased as compared to the main etching process and a second over etching process in which the ratio of the flow rate of the oxygen gas to the flow rate of the fluorocarbon-based gas is set to be reduced as compared to the first over etching process are repeatedly performed two or more times.

In accordance with the example embodiment, when the multilayer film is plasma-etched, after the main etching process, the over etching process where the first over etching process, in which a deposition amount of a CF-based polymer is small, and the second over etching process, in which the deposition amount of the CF-based polymer is great, are repeated two or more times. As a result, since the CF-based polymer serves as a protective film for the base silicon film, the base silicon film is suppressed from being etched while widening the bottom portion of the recess portion. Thus, it is possible to suppress the base loss.

Further, by repeatedly performing the first over etching process and the second over etching process, the multilayer film remaining after the main etching process is further etched. Further, the progress of the etching is suppressed if the base silicon film is exposed. Thus, it is also possible to suppress non-uniformity of the base loss.

In order to solve the above-described problem, in accordance with another aspect, a plasma processing apparatus of performing a plasma etching process on a multilayer film formed on a target substrate with a patterned mask layer as a mask by generating plasma of a processing gas within a processing chamber includes an upper electrode provided within the processing chamber; a lower electrode which is arranged to face the upper electrode and configured to mount thereon the target substrate on which the multilayer film including a laminated film, in which a first film and a second film having different relative permitivities are alternately formed on a base silicon film, is formed; a first high frequency power supply configured to apply a high frequency power for plasma generation to the lower electrode; a second high frequency power supply configured to apply a high frequency power for bias to the lower electrode; and a control unit configured to perform a main etching process of forming a recess portion in the laminated film to a predetermined depth and an over etching process of further forming the recess portion until the base silicon film is exposed by introducing the processing gas including a fluorocarbon-based gas and an oxygen gas into the processing chamber to generate the plasma and by performing the plasma etching process. Further, in the over etching process, the control unit repeatedly performs a first over etching process in which a ratio of a flow rate of the oxygen gas to a flow rate of the fluorocarbon-based gas is set to be increased as compared to the main etching process and a second over etching process in which the ratio of the flow rate of the oxygen gas to the flow rate of the fluorocarbon-based gas is set to be reduced as compared to the first over etching process two or more times.

Further, the processing gas may further include a hydrofluoro carbon-based gas, and in the second over etching process, a ratio of a flow rate of the hydrofluoro carbon-based gas in the processing gas may be set to be zero or reduced as compared to the first over etching process. Moreover, in the second over etching process, the processing gas may further include any one or both of a $CF_4$ gas and a $NF_3$ gas.

Furthermore, a number of times of repeating the first over etching process and the second over etching process may be six or more. A processing condition for the second over etching process may be the same as a processing condition for the main etching process. One of the first film and the second film constituting the laminated film may be a silicon oxide film and the other may be a silicon nitride film.

In order to solve the above-described problem, in accordance with yet another aspect, a plasma processing method performs a plasma etching process on a multilayer film formed on a target substrate arranged in a processing chamber with a patterned mask layer as a mask by generating plasma of a processing gas. Here, the multilayer film includes a laminated film in which a first film and a second film having different relative permitivities are alternately formed on a base film. Furthermore, by introducing the processing gas including a first gas and a second gas into the processing chamber to generate the plasma and by performing the plasma etching process, a main etching process of forming a recess portion in the laminated film to a predetermined depth and an over etching process of further forming the recess portion until the base film is exposed are performed. Moreover, in the over etching process, a first over etching process in which a ratio of a flow rate of the second gas to a flow rate of the first gas is set to be increased as compared to the main etching process and a second over etching process in which the ratio of the flow rate of the second gas to the flow rate of the first gas is set to be reduced as compared to the first over etching process are repeatedly performed two or more times.

Further, in the second over etching process, a ratio of a flow rate of the first gas in the processing gas may be set to be zero or reduced as compared to the first over etching process. In the second over etching process, the processing gas may further include a third gas.

Furthermore, a number of times of repeating the first over etching process and the second over etching process may be six or more. A processing condition for the second over etching process may be the same as a processing condition for the main etching process.

Effect of the Invention

In accordance with the example embodiments, when a multilayer film is plasma-etched, it is possible to suppress a base loss while widening a lower end (bottom portion) of a recess portion and also possible to suppress non-uniformity of the base loss.

MODE FOR CARRYING OUT THE INVENTION

Hereinafter, example embodiments will be explained in detail with reference to the accompanying drawings. Further, hereinafter, 1 mTorr will be assumed as $(10^{-3} \times 101325/760)$ Pa.

(Structure of Three-Dimensional Stacked Semiconductor Memory)

Figure 1:
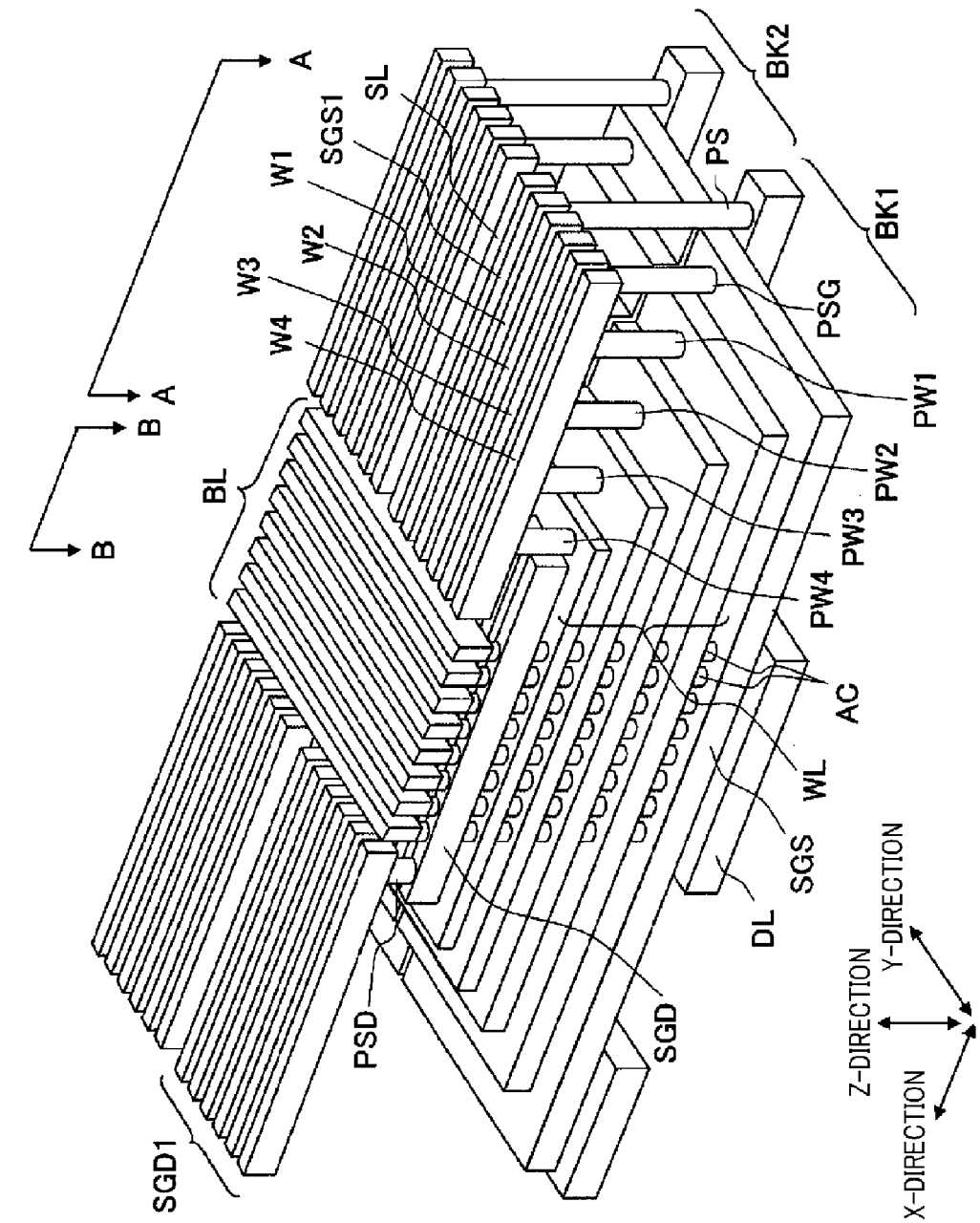
FIG. 1 is a conceptual diagram illustrating a structure of a three-dimensional stacked semiconductor memory which can be manufactured by performing an etching process on a multilayer film according to a plasma processing method in accordance with an example embodiment.
Figure 2A:
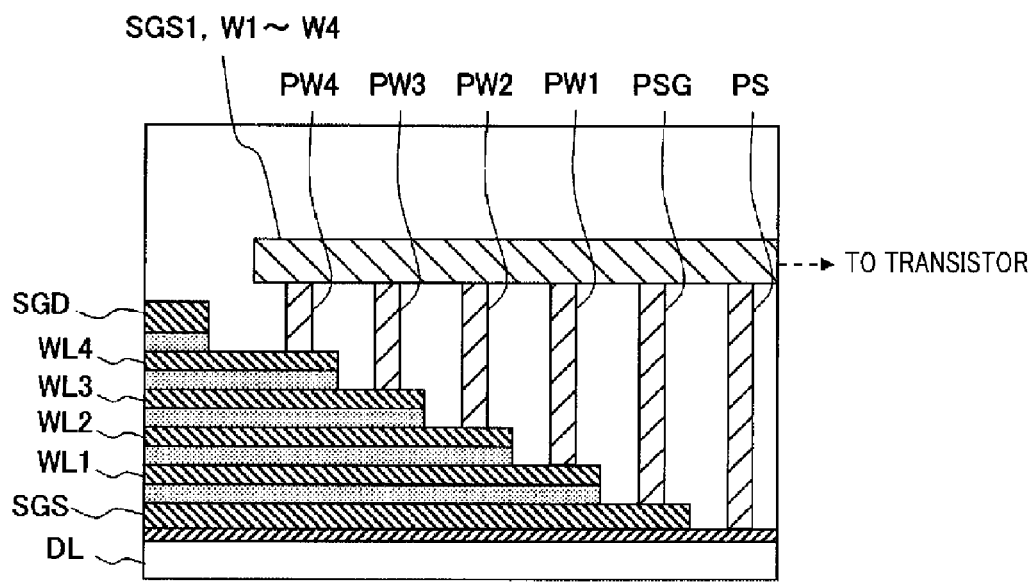
FIG. 2A is a cross-sectional view taken along a line A-A of FIG. 1.
Figure 2B:
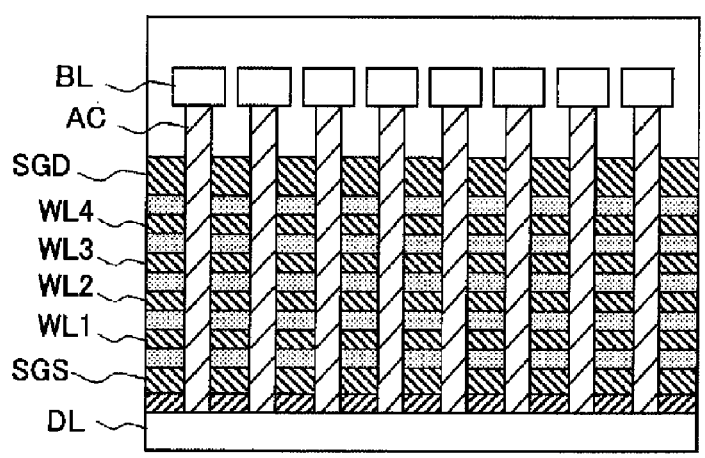
FIG. 2B is a cross-sectional view taken along a line B-B of FIG. 1.

A specific configuration example of a three-dimensional stacked semiconductor memory which can be manufactured through processes according to a plasma processing method in accordance with an example embodiment will be described with reference to the accompanying drawings. Herein, a 3D-NAND flash memory will be described as the three-dimensional stacked semiconductor memory. FIG. 1 is a perspective view illustrating a structure of the 3D-NAND flash memory. FIG. 2A is a cross-sectional view of the 3D-NAND flash memory taken along a line A-A of FIG. 1. FIG. 2B is a cross-sectional view of the 3D-NAND flash memory taken along a line B-B of FIG. 1.

The NAND flash memory illustrated in FIG. 1 includes, for example, multiple blocks each serving as a unit. In FIG. 1, two blocks BK1 and BK2 are shown. A source diffusion layer DL is formed within a semiconductor substrate, and for example, a single source diffusion layer DL common to all of the blocks is formed. The source diffusion layer DL is connected to a source line SL via a contact plug PS. On the source diffusion layer DL, there is formed a multilayer film including a laminated film in which, for example, a first film and a second film having different relative permitivities are alternately formed. Further, in FIG. 1, the multilayer film has a six-layer structure for convenience in illustration, but the multilayer film may have more than several tens to more than hundred layers, for example, 36 layers, 128 layers, etc. or may have more layers.

As depicted in FIG. 1, the other five films except the uppermost layer are respectively formed into plate shapes within each of the blocks BK1 and BK2, and end portions thereof in an X-direction are formed into step shapes in order to be contacted with the respective films. Thus, the multilayer film is formed into a substantially pyramid shape. The lowermost layer becomes a source line-side select gate line SGS, and the other four layers except the lowermost layer and the uppermost layer become four word lines WL.

The uppermost layer includes multiple conductive lines formed into line shapes extended in the X-direction. Within the block BK1, for example, six conductive lines are arranged. For example, six conductive lines of the uppermost layer become six bit line-side select gate lines SGD.

Further, multiple active layers AC constituting a NAND cell unit are formed into column shapes in a Z-direction (a direction perpendicular to a surface of the semiconductor substrate) such that the multiple active layers AC penetrate through the multiple films to reach the source diffusion layer DL.

Upper ends of the multiple active layers AC are respectively connected to multiple bit lines BL extended in a Y-direction. Further, the source line-side select gate line SGS is connected to an withdrawal line SGS1 extended in the X-direction via a contact plug PSG, and the word lines WL are connected to withdrawal lines W1 to W4 extended in the X-direction via contact plugs PW1 to PW4, respectively.

Further, the bit line-side select gate lines SGD are connected to withdrawal lines SGD1 extended in the X-direction via contact plugs PSD, respectively. The multiple bit lines BL, the withdrawal line SGS1, and the withdrawal lines W1 to W4 are made of, for example, metal.

As depicted in FIG. 2A, the source line-side select gate line SGS and the word lines WL1 to WL4 are connected to a transistor constituting a non-illustrated driver from the withdrawal line SGS1 and the withdrawal lines W1 to W4 extended in the X-direction via the contact plug PSG and the contact plugs PW1 to PW4, respectively.

As depicted in FIG. 2B, the multiple active layers AC are formed into column shapes in the Z-direction (the direction perpendicular to the surface of the semiconductor substrate) such that the multiple active layers AC penetrate through the multiple films SGD, WL4, WL3, WL2, WL1, and SGS to reach the source diffusion layer DL.

In order to form these multiple active layers AC, it is necessary to form a deep hole in the laminated film including the multiple films SGS, WL1 to WL4, and SGD. The deep hole is formed by forming a patterned mask layer on the laminated film and performing a plasma etching process thereon with the mask layer as a mask. In the plasma processing method in accordance with the present example embodiment, when the deep hole is formed in the multilayer film through the plasma etching process, the processing conditions (a kind of a gas, a gas flow rate ratio, a high frequency power, etc.) are considered, so that an etching profile of the deep hole can be improved.

(Overall Configuration of Plasma Processing Apparatus)

Figure 3:
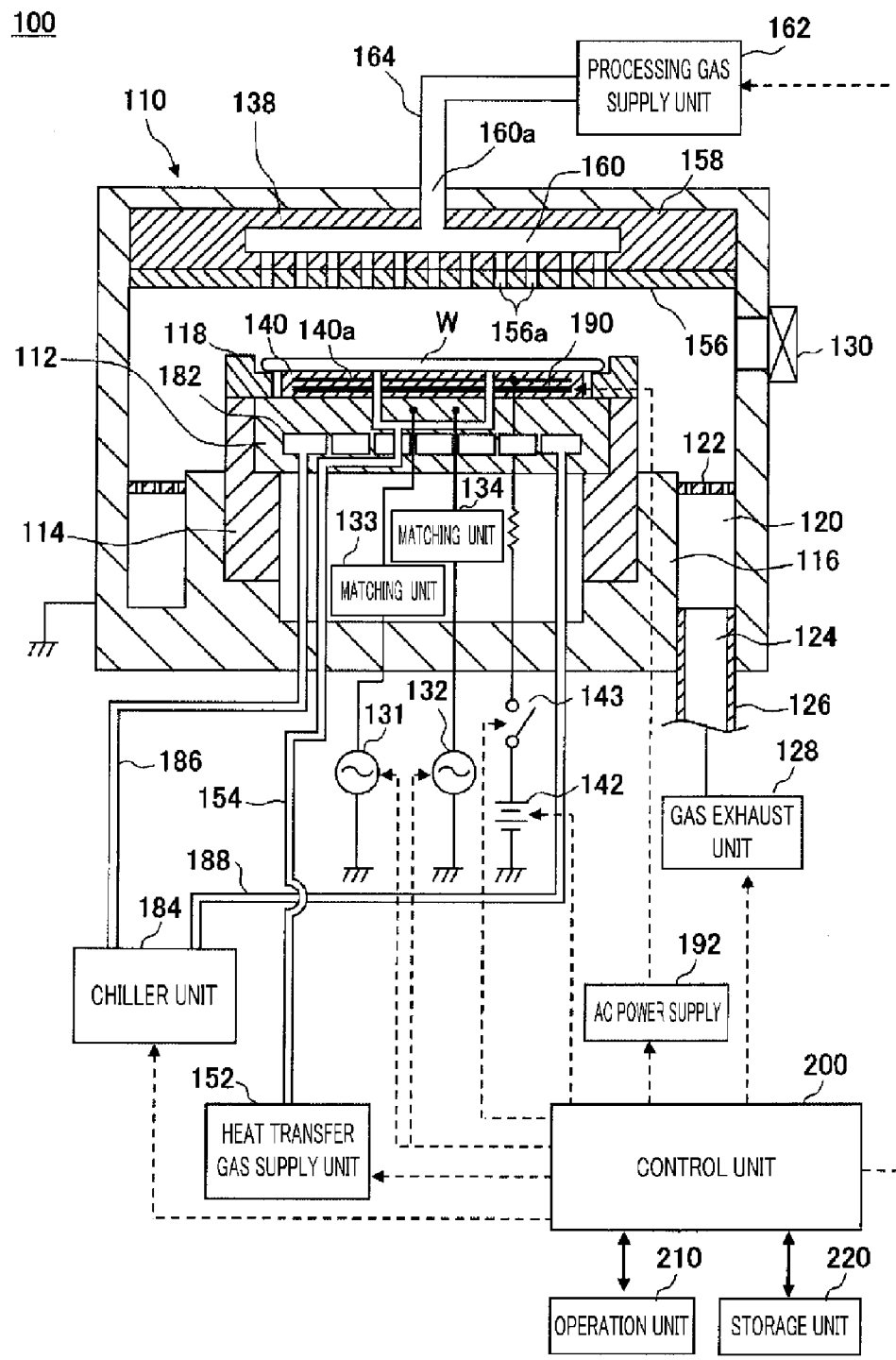
FIG. 3 is a longitudinal cross-sectional view illustrating a configuration example of a plasma processing apparatus in which the etching process in accordance with the example embodiment is performed.

Hereinafter, a configuration example of a plasma processing apparatus in which the plasma processing method in accordance with the present example embodiment can be performed will be described with reference to the accompanying drawings. Herein, the plasma processing apparatus configured as a parallel plate type (capacitively coupled) plasma etching apparatus including an upper electrode and a lower electrode arranged in parallel to face each other will be exemplified. FIG. 3 is a longitudinal cross-sectional view illustrating a schematic configuration of a plasma processing apparatus 100 in accordance with the present example embodiment.

As depicted in FIG. 3, the plasma processing apparatus 100 includes a cylindrical processing chamber (chamber) 110 made of aluminum of which a surface is, for example, alumite-treated (anodically oxidized). A housing of the processing chamber 110 is grounded.

A mounting table 112 configured to mount thereon a semiconductor wafer W (hereinafter, referred to as "wafer") as a target substrate is provided within the processing chamber 110. The mounting table 112 is made of, for example, aluminum and supported on a cylindrical supporting member 116 extended vertically upwards from the bottom of the processing chamber 110 via an insulating cylindrical holding member 114. At a peripheral portion of an electrostatic chuck 140 as an upper surface of the mounting table 112, a focus ring 118 made of, for example, silicon is provided in order to increase the etching uniformity in the entire surface thereof.

A gas exhaust path 120 is formed between a side wall of the processing chamber 110 and the cylindrical supporting member 116. An annular baffle plate 122 is provided at the gas exhaust path 120. A gas exhaust opening 124 is formed at a bottom portion of the gas exhaust path 120, and connected to a gas exhaust unit 128 via a gas exhaust line 126. The gas exhaust unit 128 includes a non-illustrated vacuum pump and is configured to depressurize a processing space within the processing chamber 110 to a preset vacuum level. At the side wall of the processing chamber 110, a transfer gate valve 130 configured to open and close a loading/unloading opening for the wafer W is provided.

The mounting table 112 is electrically connected to a first high frequency power supply 131 for plasma generation and a second high frequency power supply 132 for ion attraction (bias) in plasma via a matching unit 133 and a matching unit 134, respectively.

The first high frequency power supply 131 is configured to apply, to the mounting table 112, a first high frequency power having a frequency of, for example, 40 MHz suitable for generating plasma within the processing chamber 110. The second high frequency power supply 132 is configured to apply, to the mounting table 112, a second high frequency power, as a bias power, having a lower frequency of, for example, 3.2 MHz suitable for attracting ions in the plasma to the wafer W mounted on the mounting table 112. Thus, the mounting table 112 also serves as a lower electrode. At a ceiling portion of the processing chamber 110, a shower head 138 to be described later is provided as an upper electrode having a ground potential. Thus, the high frequency power from the first high frequency power supply 131 is capacitively applied to a space between the mounting table 112 and the shower head 138.

The electrostatic chuck 140 configured to hold the wafer W by an electrostatic attracting force is provided on the upper surface of the mounting table 112. The electrostatic chuck 140 includes an electrode 140a that is formed of a conductive film and interposed between a pair of films. The electrode 140a is electrically connected to a DC voltage supply 142 via a switch 143. The electrostatic chuck 140 is configured to attract and hold the wafer W thereon by a Coulomb force caused by applying a voltage from the DC voltage supply 142. A heat transfer gas such as a He gas is supplied from a heat transfer gas supply unit 152 into a space between an upper surface of the electrostatic chuck 140 and a rear surface of the wafer W through a gas supply line 154.

The shower head 138 provided at the ceiling portion of the processing chamber 110 includes an electrode plate 156 including multiple gas discharge holes 156a; and an electrode supporting body 158 configured to detachably support the electrode plate 156. A buffer room 160 is formed within the electrode supporting body 158, and a gas inlet opening 160a of the buffer room 160 is connected to a processing gas supply unit 162 via a gas supply line 164. Thus, a processing gas supplied from the processing gas supply unit 162 is introduced from the gas inlet opening 160a into the buffer room 160 through the gas supply line 164 to be diffused therein, and then discharged from the multiple gas discharge holes 156a into the processing chamber 110.

A cooling unit is provided within the mounting table 112. The cooling unit is configured to supply and circulate a coolant (for example, cooling water) having a preset temperature from a chiller unit 184 through, for example, a coolant line 182 provided within the mounting table 112 via lines 186 and 188. Further, a heater 190 is provided under the electrostatic chuck 140. A desired AC voltage is applied to the heater 190 from an AC power supply 192. With this configuration, the wafer W can be controlled to have a desired temperature through the cooling by the chiller unit 184 and the heating by the heater 190. Further, such a temperature control is performed based on an instruction from a control unit 200.

The control unit 200 controls components provided in the plasma processing apparatus 100, for example, the above-described gas exhaust unit 128, AC power supply 192, DC voltage supply 142, switch 143 for the electrostatic chuck, first high frequency power supply 131, second high frequency power supply 132, matching units 133 and 134, heat transfer gas supply unit 152, processing gas supply unit 162 and chiller unit 184. Further, the control unit 200 is connected to a non-illustrated host computer.

The control unit 200 is connected to an operation unit 210 including a keyboard with which an operator inputs commands for management and a display which visualizes and displays an operation status. Further, the control unit 200 is connected to a storage unit 220 in which a program for performing an etching process on the wafer W or a processing condition (recipe) for executing the program is stored.

The processing condition includes multiple parameter values, such as a control parameter, a setting parameter, etc., to control each component. The processing condition includes parameter values, such as a flow rate ratio of processing gases, a pressure within the processing chamber, a high frequency power, etc. If multiple etching processes (for example, each of main etching process, over etching process, etc.) are performed in the same manner as the plasma process in the present example embodiment, a processing condition for each etching process may be stored.

Further, the program or processing condition may be stored in a hard disk or semiconductor memory, or set in a preset location of the storage unit 220 as being accommodated in a portable computer-readable storage medium, such as a CD-ROM or DVD. Furthermore, functions of the control unit 200 may be operated and implemented using software or may be operated and implemented using hardware, or may be implemented using both of software and hardware.

(Operation of Plasma Processing Apparatus)

Hereinafter, an operation of the plasma processing apparatus 100 configured as described above will be described. In the plasma processing apparatus 100, when the plasma etching process is performed on the wafer W, the gate valve 130 is opened and the wafer W held on a transfer arm is loaded into the processing chamber 110. Then, the wafer W is placed on non-illustrated lift pins (lifter pins), and the wafer W is mounted on the electrostatic chuck 140 by lowering the lift pins. After the wafer W is loaded, the gate valve 130 is closed, and a processing gas is supplied from the processing gas supply unit 162 into the processing chamber 110 at a preset flow rate and a preset flow rate ratio, and then, a pressure within the processing chamber 110 is reduced by the gas exhaust unit 128 to a preset value.

Further, a high frequency power having a preset power for plasma generation is applied to the mounting table 112 from the first high frequency power supply 131, and a high frequency bias power having a preset power is also applied to the mounting table 112 from the second high frequency power supply 132. Furthermore, a voltage is applied to the electrode 140a of the electrostatic chuck 140 from the DC voltage supply 142 to attract the wafer W on the electrostatic chuck 140. A He gas as a heat transfer gas is supplied to the space between the upper surface of the electrostatic chuck 140 and the rear surface of the wafer W from the heat transfer gas supply unit 152.

In this state, if the processing gas is introduced from the shower head 138, the high frequency power from the first high frequency power supply 131 is applied to the mounting table 112 to excite the processing gas into plasma. As such, the plasma is generated in a plasma generation space between the upper electrode (shower head 138) and the lower electrode (mounting table 112), and a multilayer film formed on the surface of the wafer W is etched with the plasma. Further, the high frequency power from the second high frequency power supply 132 is applied to the mounting table 112 to attract ions in the plasma toward the wafer W.

After the etching process is ended, the wafer W is lifted up by the non-illustrated lift pins and separated from the mounting table 112, and the gate valve 130 is opened. The wafer W placed on the lift pins is unloaded by the non-illustrated transfer arm through the gate valve 130. Then, a next wafer W is loaded into the processing chamber 110 by the transfer arm and then, etched. By repeating these processes, multiple wafers W can be consecutively processed.

(Etching Target Film)

Figure 4:
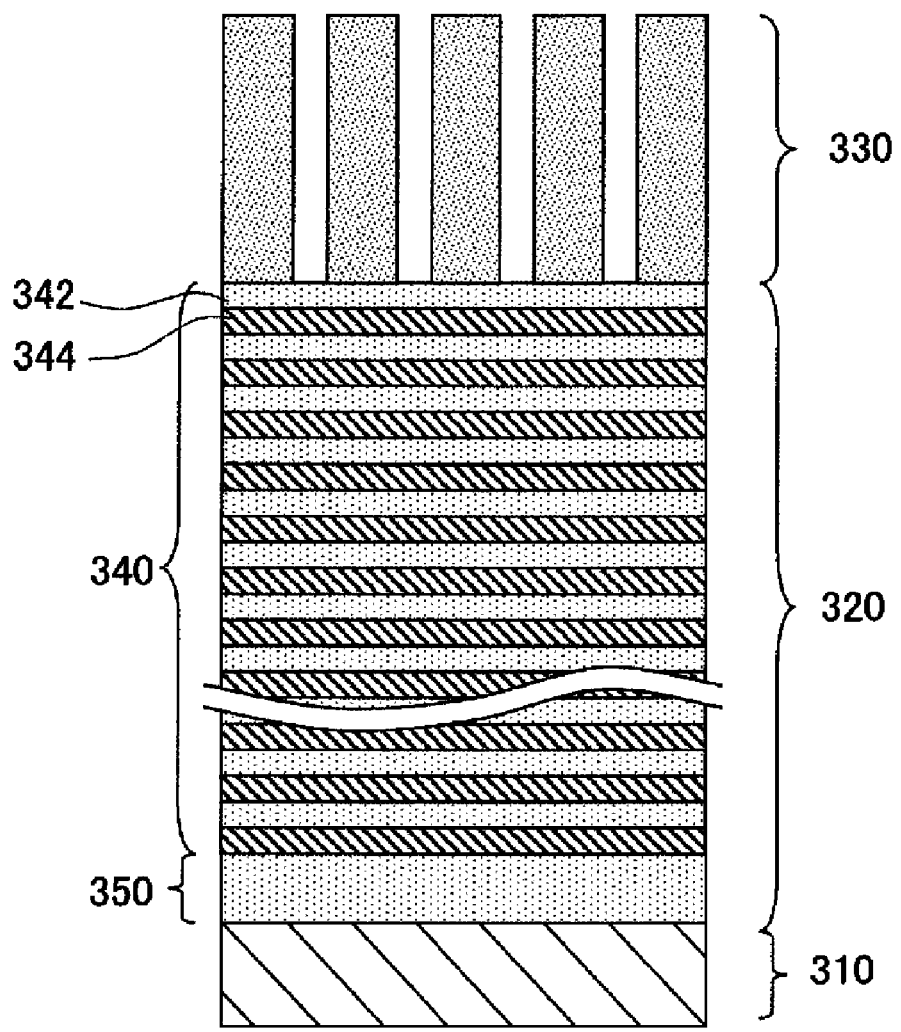
FIG. 4 is a cross-sectional view of explaining a film structure of the multilayer film in accordance with the example embodiment.

Hereinafter, a film structure of an etching target film to be etched through the plasma process in accordance with the present example embodiment will be described with reference to the accompanying drawings. Herein, a multilayer film formed on a wafer W serves as the etching target film. By etching the multilayer film through the plasma process, multiple deep recess portions (holes or trenches) are formed in the multilayer film. FIG. 4 is a cross-sectional view illustrating the film structure of the multilayer film as the etching target film.

The film structure depicted in FIG. 4 includes a multilayer film 320 formed on a base silicon film 310 and a mask layer 330 formed on the multilayer film 320. Herein, the multilayer film 320 includes a laminated film 340 in which two different kinds of films (a first film 342 and a second film 344) are alternately formed multiple times; and an etching stopper film 350 under the laminated film 340. The etching stopper film 350 is, for example, a silicon oxide film ($SiO_2$ film).

The number of layers of the laminated film 340 is, for example, 36. Further, the number of layers of the laminated film 340 is not limited thereto. The laminated film 340 may have more than several tens of layers or more than hundred layers. The first film 342 and the second film 344 constituting the laminated film 340 are films having different relative permittivities. In the present example embodiment, as the films having the different relative permittivities, a silicon oxide film ($SiO_2$ film) serves as the first film 342 and a silicon nitride film (SiN film) serves as the second film 344.

Further, the kinds of films constituting the first film 342 and the second film 344 are not limited thereto. By way of example, the films constituting the first film 342 and the second film 344 may be stacked in a reverse order of that described above. That is, the silicon oxide film may serve as the second film 344 and the silicon nitride film may serve as the first film 342.

Further, a combination of the kinds of films constituting the first film 342 and the second film 344 is not limited to the combination of the silicon oxide film and the silicon nitride film, and may include a combination of other kinds of films. A silicon oxide film ($SiO_2$ film) and a polysilicon film may be combined. In this case, the polysilicon film may or may not be doped with impurities.

Further, the relative permittivity of the polysilicon film may be changed depending on whether or not the polysilicon film is doped with impurities. Thus, a combination of the first film 342 and the second film 344 may be a combination of a polysilicon film (not doped with impurities) and a polysilicon film (doped with impurities). The impurities for doping the polysilicon film may be, for example, boron or the like.

The mask layer 330 is formed of an amorphous carbon film in which multiple openings for forming multiple recess portions in the multilayer film 320 are patterned. The amorphous carbon film used as the mask layer 330 may or may not contain boron. Further, the mask layer 330 is not limited to the amorphous carbon film and may include other organic films. Furthermore, the mask layer 330 may be a polysilicon film or the like.

When the multilayer film 320 is plasma-etched, if the etching process is performed on each of the different kinds of layers constituting the laminated film 340, the number of etching times increases as the number of layers increases, so that a throughput decreases. For this reason, the plasma etching process is performed on the laminated film with a processing gas including all gases respectively required to etch the different kinds of layers. As a result, a recess portion penetrating through the different kinds of layers can be formed by performing the plasma etching one time.

Herein, as a processing gas capable of etching the first film 342 and the second film 344 at one time, a processing gas including a fluorocarbon-based gas (CF-based gas), e.g., a $C_4F_8$ gas and a $C_4F_6$ gas, as a first gas and an oxygen gas ($O_2$ gas) as a second gas is used to perform the plasma etching process. In this case, the plasma etching process is divided into a main etching process (ME) of performing the etching process to the middle of the etching stopper film 350 and an over etching process (OE) of subsequently performing the etching process to the base silicon film 310, and the plasma etching process is performed while controlling a deposition amount of a CF-based polymer with respect to the recess portion.

To be specific, in the main etching process (ME), the etching process is performed while increasing a deposition amount of the CF-based polymer. As a result, a recess portion in a depth direction can be formed while suppressing a width of an opening from being increased. On the other hand, in the over etching process (OE), the etching process is performed while decreasing a deposition amount of the CF-based polymer. As a result, a width of the bottom opening (bottom CD value) can be increased to improve an etching profile.

By way of example, such a deposition amount of the CF-based polymer can be regulated by controlling a flow rate of the oxygen gas with respect to a flow rate of the fluorocarbon-based gas. That is, if the flow rate of the oxygen gas with respect to the flow rate of the fluorocarbon-based gas is reduced, the deposition amount of the CF-based polymer is increased. Further, if the flow rate of the oxygen gas with respect to the flow rate of the fluorocarbon-based gas is increased, the deposition amount of the CF-based polymer is decreased. For this reason, in the over etching process (OE), the flow rate of the oxygen gas with respect to the flow rate of the fluorocarbon-based gas is set to be increased as compared in the main etching process (ME) to reduce the deposition amount of the CF-based polymer. Accordingly, the width of the bottom opening (bottom CD value) can be increased.

As described above, in the over etching process (OE), the deposition amount of the CF-based polymer is small. Thus, as a time period for performing the over etching process (OE) is increased, the base silicon film 310 is also etched, so that a base loss may be increased.

In order to suppress the base loss, it may be possible to increase the time period for performing the main etching process (ME) and decrease the time period for performing the over etching process (OE). However, if so, the bottom CD value of the bottom portion may be insufficiently regulated.

As described above, there is a trade-off relationship between regulation of the bottom CD value and suppression of the base loss. Thus, it is difficult to suppress the base loss while sufficiently regulating the bottom CD value only by adjusting the time period for performing the main etching process (ME) and the time period for performing the over etching process (OE).

Therefore, the present inventors have conducted various experiments and found that it is possible to suppress the base loss while sufficiently regulating the bottom CD value by repeating a plasma etching process (deposit-less process) in which a deposition amount of the CF-based polymer is small and a plasma etching process (deposit process) in which a deposition amount of the CF-based polymer is large in the over etching process (OE).

In this case, the deposition amount of the CF-based polymer can be regulated by changing, for example, a ratio of a flow rate of the oxygen gas to a flow rate of the CF-based gas. To be specific, in the plasma etching process (deposit-less process) in which the deposition amount of the CF-based polymer is small, the ratio of the flow rate of the oxygen gas to the flow rate of the CF-based gas is increased, whereas in the plasma etching process (deposit process) in which the deposition amount of the CF-based polymer is large, the ratio of the flow rate of the oxygen gas to the flow rate of the CF-based gas is decreased.

Figure 5:
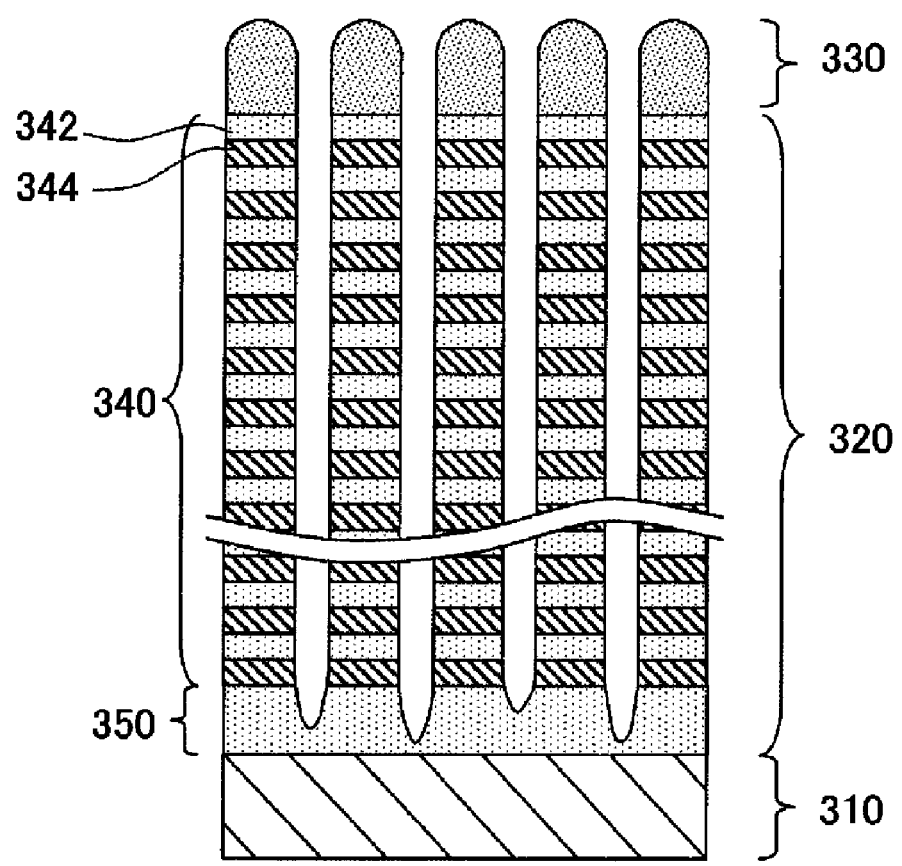
FIG. 5 is a cross-sectional view illustrating a case where a main etching process is performed on the multilayer film depicted in FIG. 4.

Hereinafter, a bottom shape of the recess portion when the multilayer film 320 depicted in FIG. 4 is etched through the main etching process (ME) and the over etching process (OE) will be described in detail with reference to the accompanying drawings. FIG. 5 is a cross-sectional view illustrating a case where the main etching process (ME) is performed by plasma-etching the multilayer film 320 depicted in FIG. 4 to a preset depth (herein, to the etching stopper film 350).

Figure 6A:
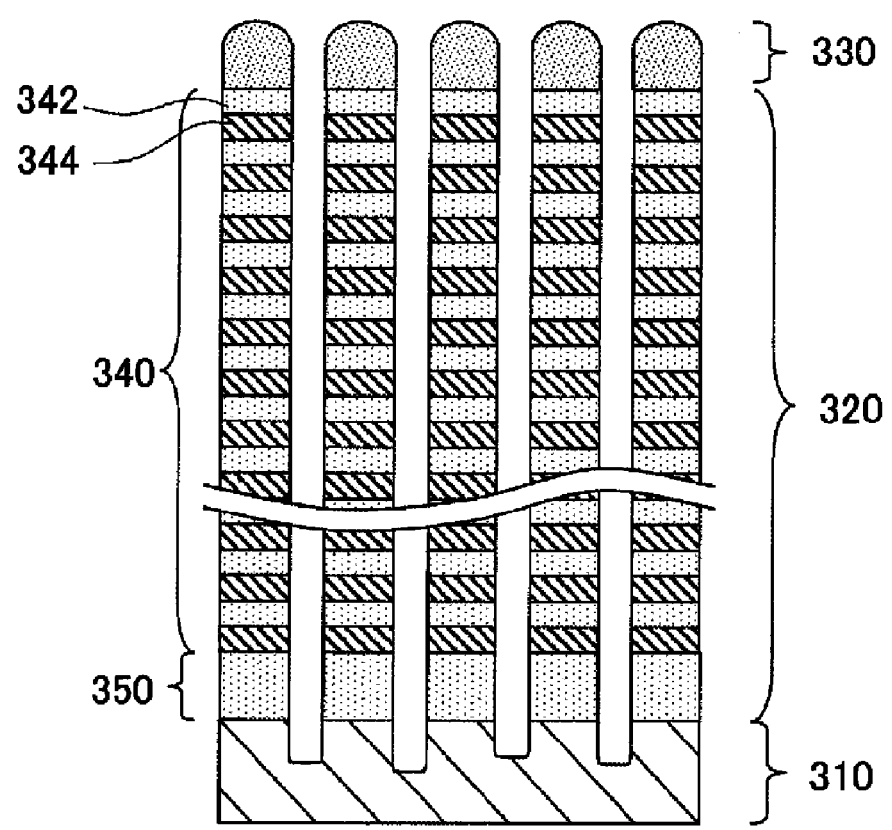
FIG. 6A is a cross-sectional view illustrating a case where an over etching process as a deposit-less process is performed on the multilayer film only one time after performing the main etching process depicted in FIG. 5.
Figure 6B:
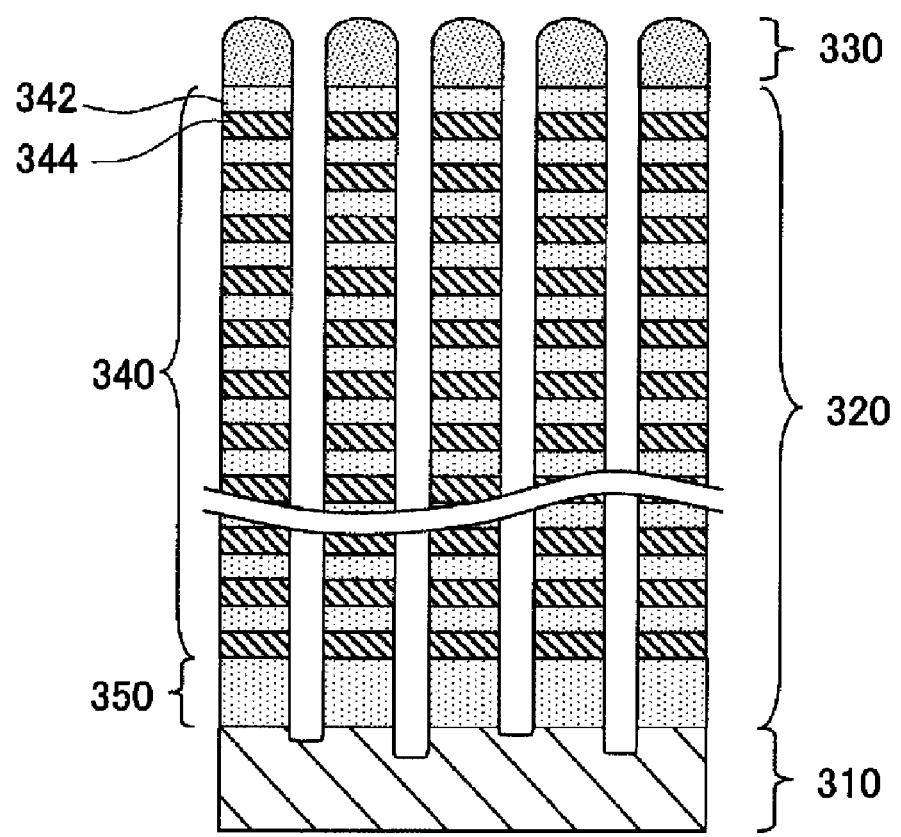
FIG. 6B is a cross-sectional view illustrating a case where a first over etching process as a deposit-less process and a second over etching process as a deposit process are respectively performed one time on the multilayer film after performing the main etching process depicted in FIG. 5.
Figure 6C:
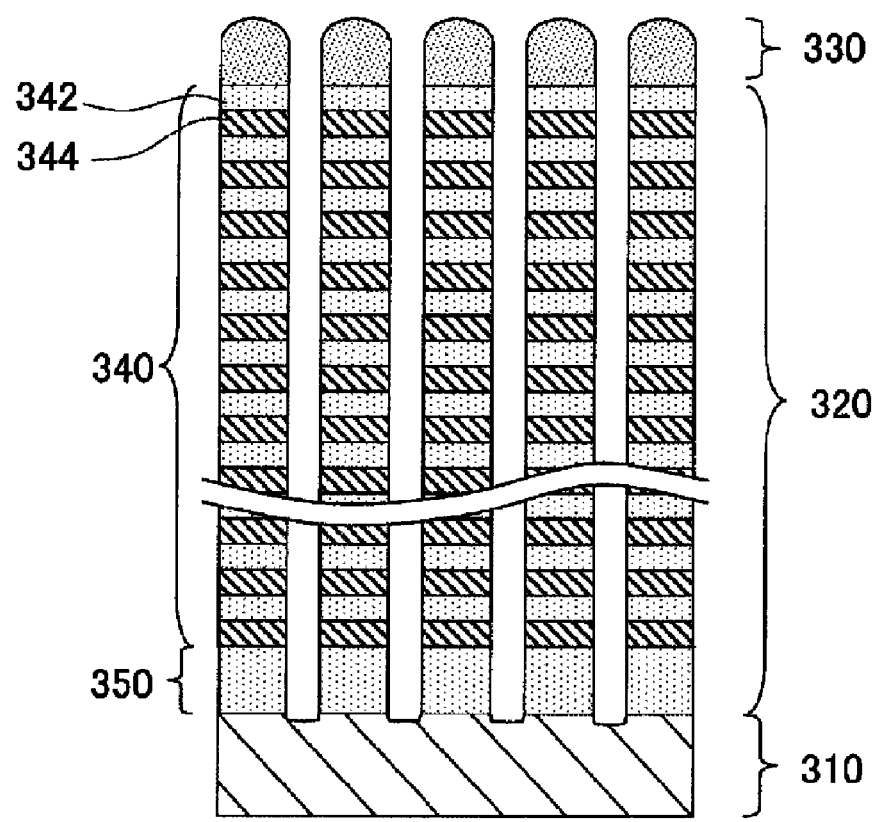
FIG. 6C is a cross-sectional view illustrating a case where the first over etching process as a deposit-less process and the second over etching process as a deposit process are alternately performed on the multilayer film multiple times after performing the main etching process depicted in FIG. 5.

FIG. 6A to FIG. 6C are cross-sectional views illustrating respective cases where different over etching processes (OE) are performed after the main etching process depicted in FIG. 5. FIG. 6A illustrates a case where a plasma process (deposit-less process) while increasing the flow rate ratio of the oxygen gas is performed only one time in the over etching process (OE). FIG. 6B illustrates a case where a plasma process (deposit-less process) while increasing the flow rate ratio of the oxygen gas and a plasma process (deposit process) while decreasing the flow rate ratio of the oxygen gas are consecutively performed one time in the over etching process (OE). FIG. 6C is a cross-sectional view illustrating a case where these plasma processes are alternately repeated two or more times.

It can be seen that if the deposit process is performed after the deposit-less process in the over etching process (OE) (FIG. 6B and FIG. 6C), the bottom CD value can be sufficiently regulated like the case where only the deposit-less process is performed (FIG. 6A) and the base loss can be decreased as compared to the case where only the deposit-less process is performed (FIG. 6A).

This may be because the etching stopper film (herein, the silicon oxide film) 350 can be etched in both of the deposit-less process and the deposit process, but the base silicon film 310 is difficult to be etched in the deposit process.

For this reason, if the over etching process (OE) including the deposit-less process and the deposit process is performed, while the bottom CD value (hole diameter or groove width) is increased in the deposit-less process, the etching stopper film (silicon oxide film) 350 is etched. Then, when the base silicon film 310 is exposed, the etching process is not performed in the deposit process. Thus, since the deposit process is performed after the deposit-less process, the bottom CD value can be sufficiently regulated and the base loss can be suppressed as shown in FIG. 6B.

Further, it can be seen that if the deposit-less process and the deposit process are alternately repeated multiple times in the over etching process (OE) (FIG. 6C), the non-uniformity in the base loss can be reduced as compared with the case where the processes are respectively performed one time (FIG. 6B).

The reason for the above can be considered as follows. Since the deposition amount of the CF-based polymer is large in the deposit process, if the base silicon film 310 is exposed, the CF-based polymer is deposited (attached) to the exposed surface thereof to serve as a protective film. As a result, it is possible to suppress the base silicon film 310 from being etched in the subsequently performed deposit-less process.

For this reason, the etching stopper film (silicon oxide film) 350 is etched by alternately performing the deposit-less process and the deposit process multiple times in the over etching process (OE), but when the base silicon film 310 is exposed, the etching is suppressed. Thus, even if there is non-uniformity in depth of the recess portion after the main etching process is performed, since the deposit-less process and the deposit process are alternately repeated multiple times in the over etching process (OE), the non-uniformity in depth of the recess portion is gradually reduced. Therefore, as shown in FIG. 6C, non-uniformity in the base loss can be suppressed.

In accordance with the plasma etching process of the present example embodiment, the base loss as well as non-uniformity of the base loss can be suppressed while sufficiently regulating the bottom CD value by alternately repeating the deposit-less process and the deposit process multiple times in the over etching process (OE).

(Etching Process of Multilayer Film)

Figure 7:
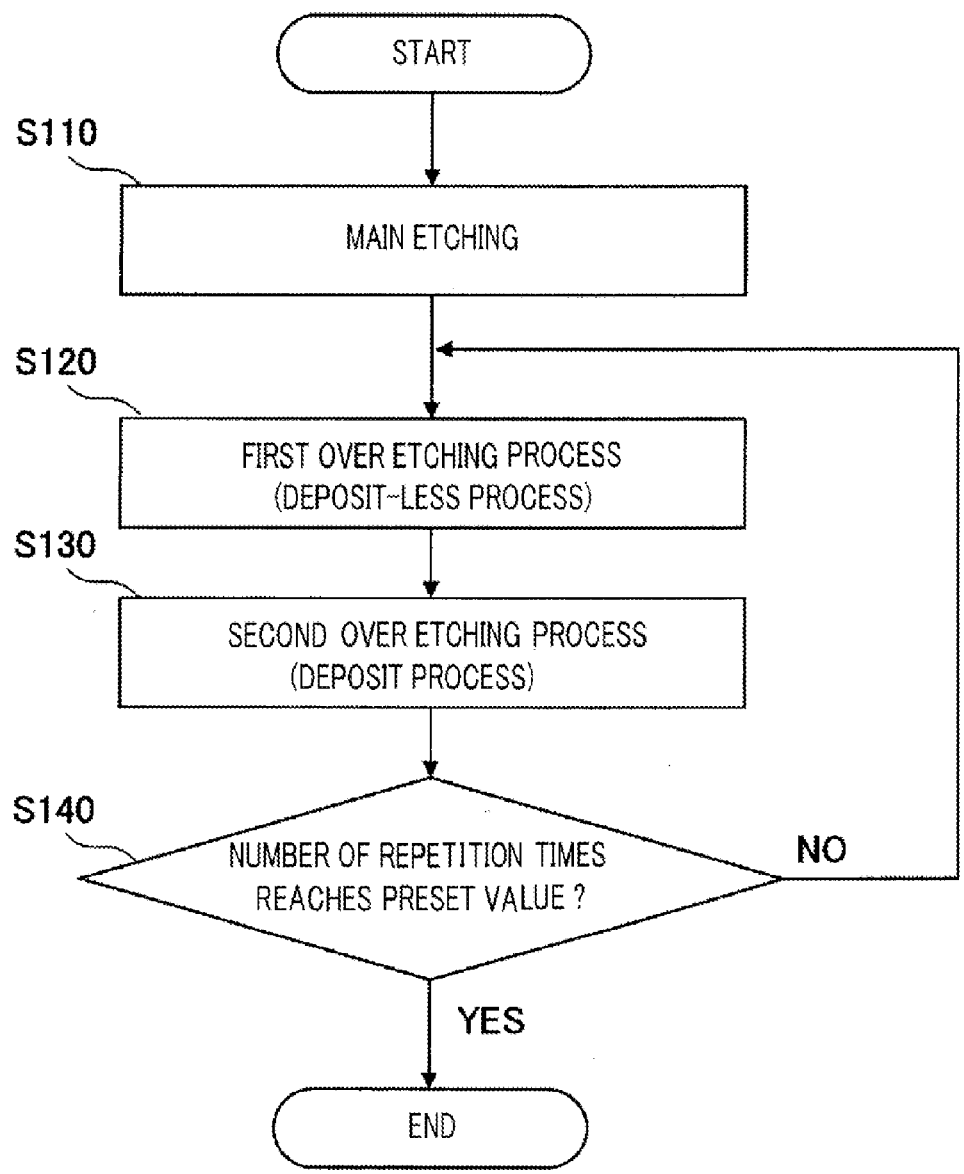
FIG. 7 is a flow chart schematically illustrating the etching process in the example embodiment.

Hereinafter, the plasma etching process of the multilayer film in the present example embodiment will be described in detail with reference to the accompanying drawings. The plasma etching process is performed by the control unit 200 based on a preset processing condition. FIG. 7 is a flow chart schematically illustrating the plasma etching process performed by the control unit. Herein, the plasma etching process of forming deep holes penetrating through the multilayer film to form the multiple active layers AC in the multilayer film depicted in FIG. 1 will be exemplified.

Figure 8A:
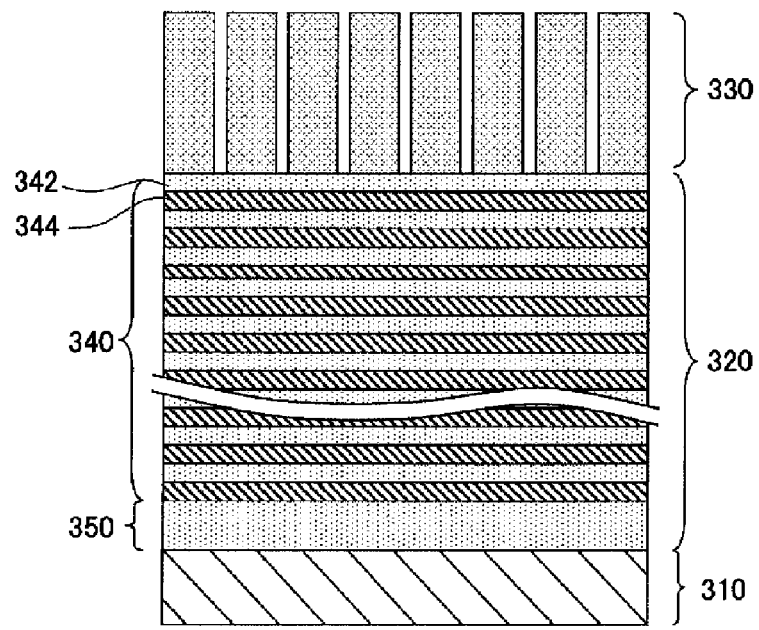
FIG. 8A is a process diagram of the etching process in the example embodiment and cross-sectional view of explaining the multilayer film before performing the etching process in accordance with the present example embodiment.

To be specific, the plasma etching process is performed on the wafer W on which the multilayer film 320 depicted in FIG. 8A is formed. Herein, as depicted in FIG. 8A, the multilayer film includes the laminated film 340 in which the first film 342 and the second film 344 are alternately formed on the base silicon film 310 via the etching stopper film 350 (herein, the silicon oxide film); and the mask layer 330 which is formed on the laminated film 340 and in which openings are patterned.

According to the plasma etching process depicted in FIG. 7, in a process S110, the main etching process (ME) of forming a hole to a preset depth (herein, to the middle of the etching stopper film 350) while suppressing an increase in a diameter of the hole is performed. Then, in processes S120 to S140, the over etching process (OE) of increasing the bottom CD value at a bottom portion of the hole and improving a shape of the bottom portion while suppressing the base silicon film from being etched is performed.

Figure 8B:
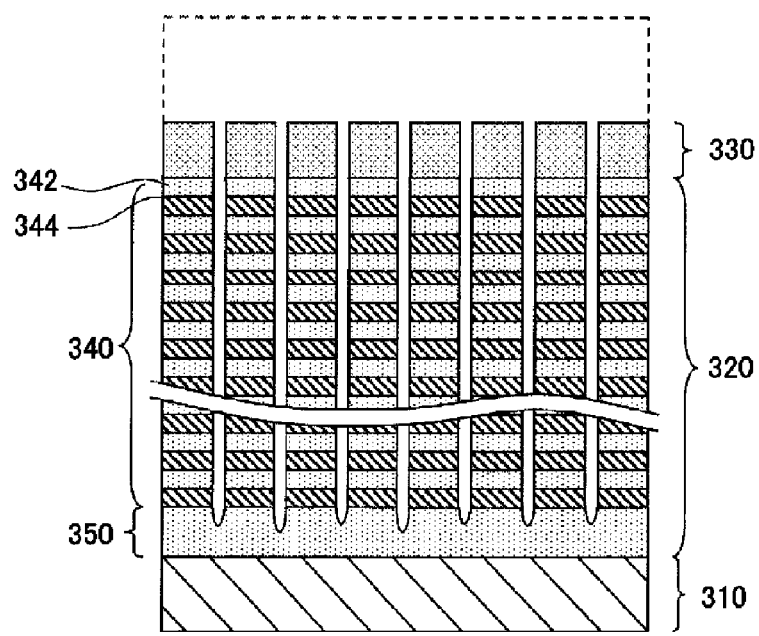
FIG. 8B is a process diagram subsequent to FIG. 8A and cross-sectional view of explaining a status after the main etching process.
Figure 8C:
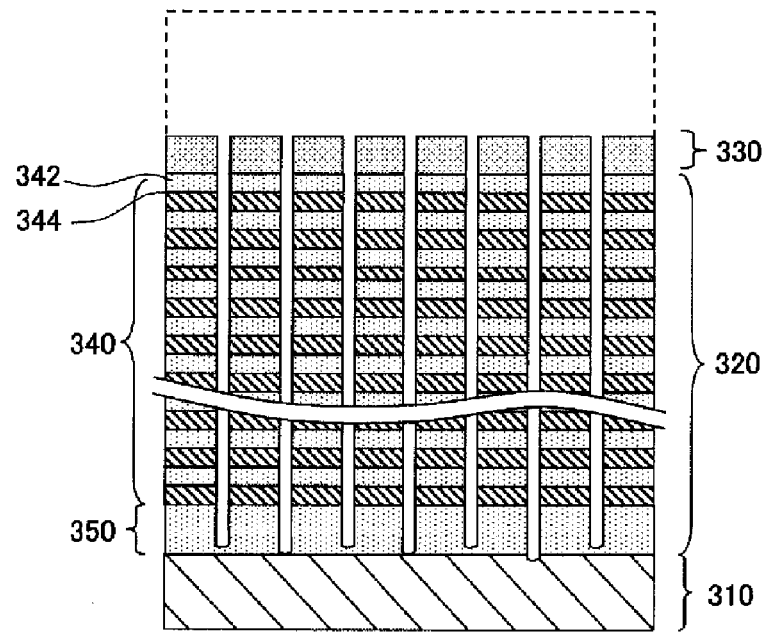
FIG. 8C is a process diagram subsequent to FIG. 8B and cross-sectional view of explaining a status during the over etching process.
Figure 8D:
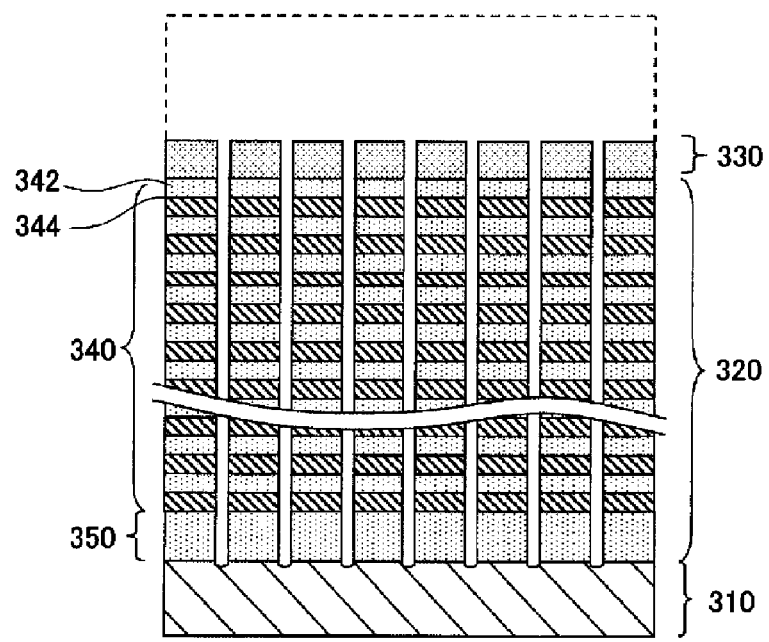
FIG. 8D is a process diagram subsequent to FIG. 8C and cross-sectional view of explaining a status after the over etching process.

FIG. 8B to FIG. 8D illustrate cross-sectional views in the respective processes of the plasma etching process performed on the multilayer film in accordance with the present example embodiment. FIG. 8B illustrates a status after the main etching process (ME). FIG. 8C illustrates a status during the over etching process (OE), and FIG. 8D illustrates a status after the over etching process (OE).

(Main Etching Process)

In the main etching process (ME) shown in the process S110 of FIG. 7, the main etching process is performed on the multilayer film 320 depicted in FIG. 8A to a preset depth, for example, to the middle of the etching stopper film 350 as depicted in FIG. 8B, with the mask layer 330 as an etching mask. Desirably, a ratio of a flow rate of the oxygen gas to a flow rate of the CF-based gas may be 0.2 to 0.5.

To be specific, in the main etching process (ME), the plasma etching process is performed with a processing gas including a $C_4F_8$ gas and a $C_4F_6$ gas as CF-based gases for etching the first film 342 and the second film 344 and an oxygen gas ($O_2$ gas). The processing gas may include an Ar gas or a hydrofluoro carbon-based gas (CHF-based gas) such as a $CH_2F_2$ gas.

Further, in the present example embodiment, there has been described a case where the $C_4F_8$ gas and the $C_4F_6$ gas are used as the CF-based gases for etching the first film (silicon oxide film) 342 and the second film (silicon nitride film) 344, but the present example embodiment is not limited thereto. Other fluorocarbon-based gases (CF-based gases) than the $C_4F_8$ gas and the $C_4F_6$ gas may be used.

Furthermore, herein, there has been described a case where the multilayer film 320 is etched to a preset depth by performing the main etching process one time, but the present example embodiment is not limited thereto. The multilayer film 320 may be etched to a preset depth by performing the main etching process two or more times while changing a kind of a gas or a flow rate thereof. In this case, as a depth of the hole formed in the laminated film is increased, the number of times of the main etching process may be increased.

(Over etching process)

Hereinafter, in the over etching process (OE) shown in the processes S120 to S140 of FIG. 7, the first over etching process as a deposit-less process in which the deposition amount of the CF-based polymer is small and the second over etching process as a deposit process in which the deposition amount of the CF-based polymer is large are alternately repeated a preset number of times.

Like the main etching process, in the first over etching process and the second over etching process, a plasma etching process is performed with a processing gas including a $C_4F_8$ gas and a $C_4F_6$ gas as CF-based gases for etching the first film 342 and the second film 344 and an oxygen gas ($O_2$ gas). The processing gas may include an Ar gas or a CHF-based gas (for example, a $CH_2F_2$ gas).

In this case, in the first over etching process, the deposition amount of the CF-based polymer can be decreased by increasing a flow rate of the oxygen gas with respect to a flow rate of the CF-based gas as compared to the main etching process. Further, in the second over etching process, the deposition amount of the CF-based polymer can be increased by decreasing the flow rate of the oxygen gas with respect to the flow rate of the CF-based gas as compared with the first over etching process. In this case, desirably, a ratio of the flow rate of the oxygen gas to the flow rate of the CF-based gas in the first over etching process may be 0.6 to 0.9, and a ratio of the flow rate of the oxygen gas to the flow rate of the CF-based gas in the second over etching process may be 0.2 to 0.5.

After the first over etching process of the process S120 and the second over etching process of the process S130 are performed as such, it is determined whether the number of repetition times reaches a preset value in the process S140. If the number of repetition times does not reach the preset value, the process returns back to the process S120 and the first over etching of the process S120 and the second over etching of the process S130 are alternately repeated until the number of repetition times reaches the preset value. Thus, even if there is non-uniformity in depth of the hole after the main etching process as depicted in FIG. 8B, a hole where the base silicon film 310 is not exposed is further etched and a hole where the base silicon film 310 is exposed is suppressed from being further etched, as depicted in FIG. 8C.

Since the first over etching process and the second over etching process are alternately repeated as such, a depth of the hole is adjusted to be uniform and a difference in the base loss is corrected. Further, if the number of repetition times reaches the preset value, a series of the plasma etching processes is ended. Thus, the etching process is completed with respect to all of the holes as depicted in FIG. 8D.

As such, by performing the over etching process (OE) in which the first over etching process with a small deposition amount of the CF-based polymer and the second over etching process with a great deposition amount of the CF-based polymer are alternately repeated multiple times, it is possible to suppress the base loss as well as non-uniformity of the base loss while increasing the bottom CD value.

Further, if the processing gas includes a CHF-based gas, a flow rate of the CHF-based gas is set to be 0 or reduced in the second over etching process, so that an effect of suppressing the base loss can be enhanced. This is because if hydrogen atoms (H) are contained in the processing gas, the base silicon film 310 can be easily etched, so that an effect of suppressing the base silicon film 310 from being etched can be enhanced by reducing the hydrogen atoms (H).

Furthermore, in the second over etching process, a $CF_4$ gas or a $NF_3$ gas may be added as a third gas into the processing gas. The $CF_4$ gas and the $NF_3$ gas are likely to etch in a transverse direction, so that an effect of increasing the bottom CD value can be enhanced. Further, since oxygen atoms (O) can be reduced by adding the $CF_4$ gas or the $NF_3$ gas into the processing gas, an effect of increasing the deposition amount of the CF polymer can be obtained like the case of further decreasing the oxygen gas ($O_2$ gas). For this reason, the effect of suppressing the base loss can be further enhanced.

Moreover, the first over etching process and the second over etching process may be repeated desirably at least two times, and more desirably, at least six times. The number of repetition times may be determined based on the non-uniformity in depth of the hole after the main etching process. By way of example, as the non-uniformity in depth of the hole after the main etching process is increased, the number of repetition times of performing the first over etching process and the second over etching process is also increased. Thus, the non-uniformity in the base loss can be suppressed.

Further, the flow chart shown in FIG. 7 exemplifies a case where the first over etching process and the second over etching process are alternately repeated in sequence a preset number of times in the over etching process (OE) after the main etching process (ME), but is not limited thereto. By way of example, after the main etching process (ME), the first over etching process may be performed, and then, the second over etching process and the first over etching process may be alternately repeated in sequence a preset number of times. Further, a processing condition for the second over etching process may be the same as the processing condition of the main etching process (ME).

In the over etching process (OE), the second high frequency power for bias may be pulse-modulated and then applied in a pulse form. Thus, the bottom CD value can be further increased.

Hereinafter, this will be described in detail. If positive ions are continuously implanted with a second high frequency power for bias in a continuous waveform, a bottom portion of a hole is charged with positive charges. In this state, if positive ions are further implanted into the hole, the positive charges charged in the bottom portion of the hole repulse the positive ions. Thus, it may be difficult to implant ions into the bottom portion of the hole depending on an amount of charges therein, so that it may be difficult to etch the bottom portion of the hole.

Herein, since the second high frequency power for bias is pulse-modulated at a high cycle and then applied in a pulse form, the positive charges charged in the bottom portion of the hole while the second high frequency power is applied are discharged from the bottom portion of the hole while the second high frequency power is not applied. Accordingly, by applying the high frequency power in the pulse form, the positive charges collected at the bottom portion of the hole can be reduced. Thus, repulsion between the positive charges and the ions can be suppressed, and it becomes easy to implant positive ions into the bottom portion of the hole. As a result, the bottom portion of the hole can be further etched, so that the effect of increasing the bottom CD value can be enhanced.

(Result of First Experiment)

Hereinafter, there will be described a result of a first experiment for confirming an effect of the etching process in accordance with the present example embodiment. Each of FIG. 9A and FIG. 9B illustrates traces in a scanning electron microscopic (SEM) image of a bottom cross section of a recess portion (herein, hole) formed by performing an etching process according to the first experiment on the laminated film 340 depicted in FIG. 8A.

Figure 9A:
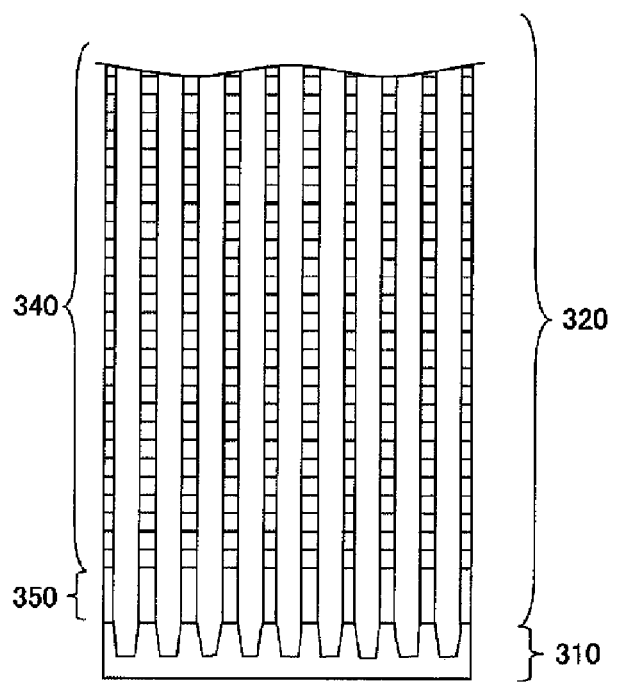
FIG. 9A illustrates an experimental result in the case of performing an etching process of a comparative example in accordance with a first experiment, and also illustrates traces in a scanning electron microscopic image of a cross section of a recess portion.

FIG. 9A illustrates an experimental result of a comparative example in which a plasma etching process as a deposit-less process is performed only one time in an over etching process (OE) after a main etching process (ME). FIG. 9B illustrates an experimental result of the present example embodiment in which a first over etching process as a deposit-less process and a second over etching process as a deposit process are repeated multiple times in an over etching process (OE) after the same main etching process (ME).

In FIG. 9A, after a main etching process is performed two times as the main etching process (ME), an over etching process is performed one time as the over etching process (OE). To be specific, in the main etching process (ME), a first main etching process is performed to about 90% of the laminated film 340 under the following processing condition (1-1) and then a second main etching process is performed for 215 seconds under the following processing condition (1-2). Further, in the subsequent over etching process (OE), a first over etching process is performed only one time for 200 seconds under the following processing condition (1-3).

Figure 9B:
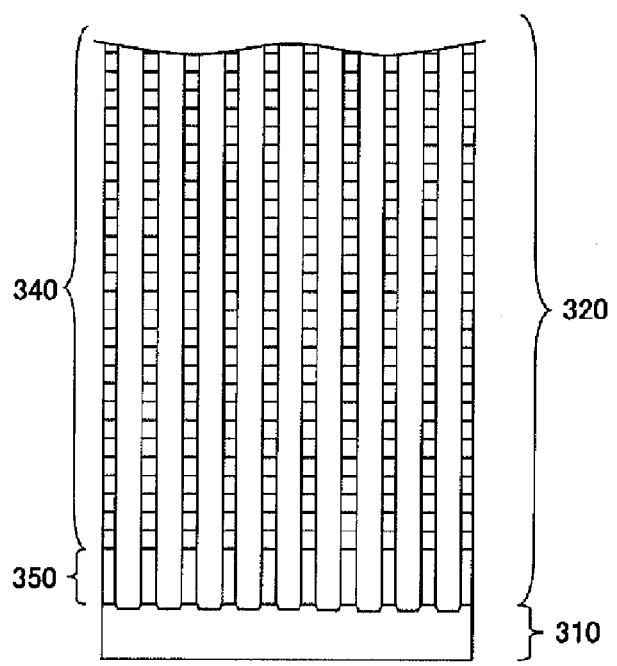
FIG. 9B illustrates an experimental result in the case of performing the etching process of the present example embodiment in accordance with the first experiment, and also illustrates traces in a scanning electron microscopic image of the cross section of the recess portion.

In FIG. 9B, after a main etching process is performed two times as the main etching process (ME) in the same manner as shown in FIG. 9A, as the over etching process (OE), a first over etching process as a deposit-less process and a second over etching process as a deposit process are repeated six times within the substantially same time period as the over etching process (OE) shown in FIG. 9A.

To be specific, in the main etching process (ME), a first main etching process is performed to about 90% of the laminated film 340 under the following processing condition (1-1) and then a second main etching process is performed for 215 seconds under the following processing condition (1-2) in the same manner as shown in FIG. 9A. Further, in the subsequent over etching process (OE), a first over etching process as a deposit-less process under the following processing condition (1-3) and a second over etching process as a deposit process under the following processing condition (1-4) where the flow rate of the oxygen gas is decreased are alternately repeated six times.

In the processing condition (1-4) for the second over etching process, as compared with the processing condition (1-3) for the first over etching process, the flow rate of the oxygen gas is decreased, the $C_4F_8$ gas is changed to the $CF_4$ gas, which is easier to deposit the CF-based polymer, and a $NF_3$ gas is added. Thus, the second over etching process serves as a deposit process in which the deposition amount of the CF-based polymer is large. Herein, a time period for performing the first over etching process one time and a time period for performing the second over etching process one time are set to be 23 seconds and 10 seconds, respectively, such that the total time period for performing the over etching process (OE) can be 200 seconds substantially equivalent to the time period in FIG. 9A.

(Processing Condition (1-1)) First Main Etching Process

Internal pressure of processing chamber: 15 mTorr to 30 mTorr

Frequency/power of first high frequency power: 40 MHz/ 700 W to 1500 W

Frequency/power of second high frequency power: 3.2 MHz/5000 W to 7000 W

Flow rate ratio of processing gas: $C_4F_8/C_4F_6/CH_2F_2/Ar/O_2$=100/80/100/80/135

(Processing Condition (1-2)) Second Main Etching Process

Internal pressure of processing chamber: 15 mTorr to 30 mTorr

Frequency/power of first high frequency power: 40 MHz/ 700 W to 1500 W

Frequency/power of second high frequency power: 3.2 MHz/5000 W to 7000 W

Flow rate ratio of processing gas: $C_4F_8/C_4F_8/CH_2F_2/NF_3/Ar/O_2$=45/46/34/10/100/43

(Processing Condition (1-3)) First Over Etching Process

Internal pressure of processing chamber: 35 mTorr to 70 mTorr

Frequency/power of first high frequency power: 40 MHz/ 600 W to 1400 W

Frequency/power of second high frequency power: 3.2 MHz/5000 W to 7000 W

Flow rate ratio of processing gas: $C_4F_8/C_4F_6/CH_2F_2/CHF_3/Ar/O_2$=20/70/50/20/400/110

(Processing Condition (1-4)) Second Over Etching Process

Internal pressure of processing chamber: 35 mTorr to 70 mTorr

Frequency/power of first high frequency power: 40 MHz/ 600 W to 1400 W

Frequency/power of second high frequency power: 3.2 MHz/5000 W to 7000 W

Flow rate ratio of processing gas: $CF_4/C_4F_6/CH_2F_2/NF_3/Ar/O_2$=45/46/34/100/100/43

According to the result of the first experiment, it can be seen that in the case of the present example embodiment (FIG. 9B), a depth of a hole in the base silicon film 310 is decreased and depths of the respective holes are substantially equal to each other, so that non-uniformity in the base loss is suppressed, as compared to the case of the comparative example (FIG. 9A). According to measurement results of an etched amount of the base silicon film 310, an etched amount in the case of the comparative example in which the first over etching process is performed only one time (FIG. 9A) is 120 nm, whereas an etched amount in the case of the present example embodiment in which the first over etching process and the second over etching process are alternately repeated six times (FIG. 9B) is 47 nm. Thus, it can be seen that the base loss is remarkably reduced. Further, in both of the cases as shown in FIG. 9A and FIG. 9B, a diameter of the hole at the bottom portion thereof is increased in the substantially same manner.

Further, the same experiment is conducted in the cases where the first over etching process and the second over etching process are alternately repeated two times and four times, respectively. Then, an etched amount of the base silicon film 310 is measured. According to the measurement results, an etched amount in the case where the first over etching process and the second over etching process are repeated two times is 90 nm, and an etched amount in the case where the first over etching process and the second over etching process are repeated four times is 47 nm. Thus, it can be seen that the etched amounts in the both cases are reduced as compared with 120 nm in the case where the first over etching is performed only one time. Further, it can be seen that as the number of repetition times is increased to two times, four times, and six times, the base loss is decreased.

Thus, the experiment makes it clear that it is possible to highly suppress the base loss as well as the non-uniformity of the base loss while increasing the bottom CD value through the over etching process of the present example embodiment.

(Result Of Second Experiment)

Hereinafter, there will be described a result of a second experiment conducted under processing conditions different from those of the first experiment for confirming an effect of the etching process in accordance with the present example embodiment. Each of FIG. 10A and FIG. 10B illustrates traces in a scanning electron microscopic (SEM) image of a bottom cross section of a recess portion (herein, hole) formed by performing an etching process according to the second experiment on the laminated film 340 depicted in FIG. 8A.

Figure 10A:
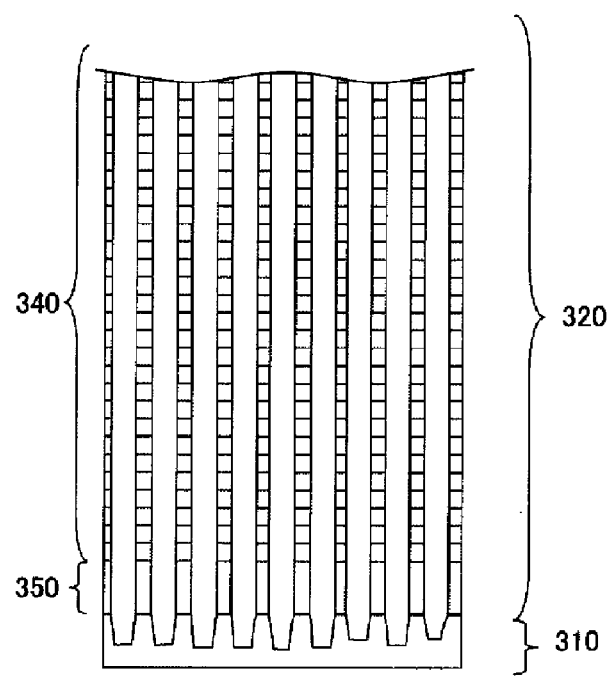
FIG. 10A illustrates an experimental result in the case of performing an etching process of a comparative example in accordance with a second experiment, and also illustrates traces in a scanning electron microscopic image of a cross section of a recess portion.

FIG. 10A illustrates an experimental result of a comparative example in which a plasma etching process as a deposit-less process is performed only one time in an over etching process (OE) after a main etching process (ME). FIG. 10B illustrates an experimental result of the present example embodiment in which a first over etching process as a deposit-less process and a second over etching process as a deposit process are repeated multiple times in an over etching process (OE) after the same main etching process (ME).

In FIG. 10A, after a main etching process is performed one time as the main etching process (ME), an over etching process is performed one time as the over etching process (OE). To be specific, in the main etching process (ME), a main etching process is performed until the etching stopper film 350 is etched under the following processing condition (2-1). Further, in the subsequent over etching process (OE), a first over etching process is performed only one time for 180 seconds under the following processing condition (2-2).

Figure 10B:
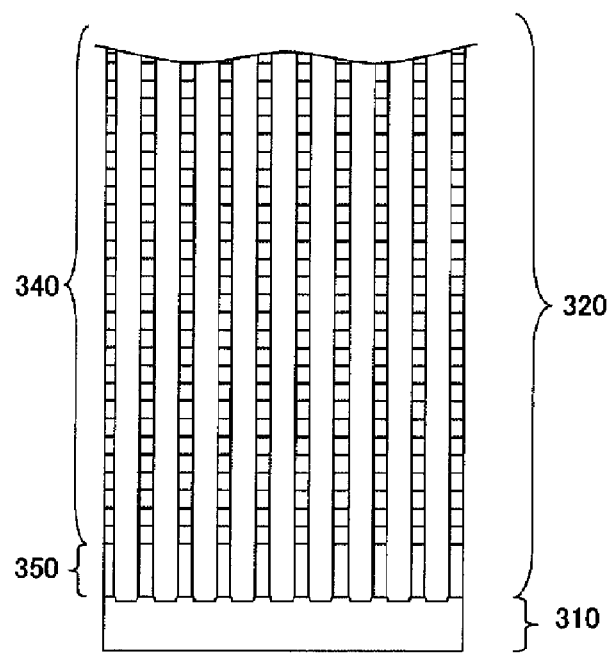
FIG. 10B illustrates an experimental result in the case of performing the etching process of the present example embodiment in accordance with the second experiment, and also illustrates traces in a scanning electron microscopic image of the cross section of the recess portion.

In FIG. 10B, after a main etching process is performed one time as the main etching process (ME) in the same manner as shown in FIG. 10A, as the over etching process (OE), a first over etching process as a deposit-less process and a second over etching process as a deposit process are repeated nine times within the substantially same time period as the over etching process (OE) shown in FIG. 10A.

To be specific, in the main etching process (ME), a main etching process is performed until the etching stopper film 350 is etched under the following processing condition (2-1) in the same manner as shown in FIG. 10A. Further, in the subsequent over etching process (OE), a first over etching process as a deposit-less process under the following processing condition (2-2) and a second over etching process as a deposit process under the following processing condition (2-3) where a flow rate of an oxygen gas is decreased are alternately repeated nine times.

In the processing condition (2-3) for the second over etching process, as compared with the processing condition (2-2) for the first over etching process, a flow rate of an oxygen gas is decreased and a CHF-based gas ($CH_2F_2$/$CHF_3$) is set to be 0 (not added). Thus, the second over etching process serves as a deposit process in which the deposition amount of the CF-based polymer is large and the base silicon film 310 is further suppressed from being etched. A ratio of $CH_2F_2$/$CHF_3$ is desirably 0 to 10, and more desirably 0 to 7. Herein, a time period for performing the first over etching process one time and a time period for performing the second over etching process one time is set to be 10 seconds, respectively, such that the total time for performing the over etching process (OE) can be 180 seconds equivalent to the time period in FIG. 10A.

(Processing Condition (2-1))

Internal pressure of processing chamber: 20 mTorr to 40 mTorr

Frequency/power of first high frequency power: 40 MHz/500 W to 1300 W

Frequency/power of second high frequency power: 3.2 MHz/5000 W to 7000 W

Flow rate ratio of processing gas: $C_4F_8$/$C_4F_6$/$CH_2F_2$/Ar/$O_2$=50 to 60/90 to 100/95/100/145

(Processing Condition (2-2))

Internal pressure of processing chamber: 35 mTorr to 70 mTorr

Frequency/power of first high frequency power: 40 MHz/600 W to 1400 W

Frequency/power of second high frequency power: 3.2 MHz/5000 W to 7000 W

Flow rate ratio of processing gas: $C_4F_8$/$C_4F_6$/$CH_2F_2$/$CHF_3$/Ar/$O_2$=20 to 25/65 to 70/35 to 50/20/400/110

(Processing Condition (2-3))

Internal pressure of processing chamber: 35 mTorr to 70 mTorr

Frequency/power of first high frequency power: 40 MHz/600 W to 1400 W

Frequency/power of second high frequency power: 3.2 MHz/5000 W to 7000 W

Flow rate ratio of processing gas: $C_4F_8$/$C_4F_6$/$CH_2F_2$/$CHF_3$/Ar/$O_2$=20 to 25/65 to 75/0/0/1200/80

According to the result of the second experiment, it can be seen that in the case of the present example embodiment (FIG. 10B), the depth of the hole in the base silicon film 310 is decreased and depths of the respective holes are substantially equal to each other, so that the difference in the base loss is suppressed, as compared with the case of the comparative example (FIG. 10A). According to measurement results of an etched amount of the base silicon film 310, an etched amount in the case of the comparative example in which the first over etching process is performed only one time (FIG. 10A) is 124 nm, whereas an etched amount in the case of the present example embodiment in which the first over etching process and the second over etching process are alternately repeated nine times (FIG. 10B) is 36 nm. Thus, it can be seen that the base loss is remarkably reduced. Further, in both of the cases as shown in FIG. 10A and FIG. 10B, a diameter of the hole at the bottom thereof is increased in the substantially same manner.

Thus, it can also be seen from the second experiment using the processing conditions different from those of the first experiment that it is possible to suppress the base loss as well as the non-uniformity of the base loss while increasing the bottom CD value through the over etching process of the present example embodiment.

As described above, according to the plasma etching process of the present example embodiment, it is possible to suppress the base loss as well as the non-uniformity of the base loss while increasing the bottom CD value.

Although the example embodiment has been explained above with reference to the accompanying drawings, the present disclosure is not limited thereto. It is clear that various changes and modifications may be made by those skilled in the art in the scope of the present disclosure defined by the following claims, and it shall be understood that all modifications and embodiments conceived from the meaning and scope of the claims and their equivalents are included in the scope of the present disclosure.

By way of example, in the above-described example embodiment, it has been described that the hole is formed as a recess portion in the laminated film. However, the plasma process in accordance with the present disclosure can be applied to a case where a trench (groove) such as a line and space (L&S) is formed as a recess portion in the laminated film.

Further, the target substrate on which the plasma process of the present disclosure is performed is not limited to the semiconductor wafer, and may include, for example, a large-scaled substrate for a flat panel display (FPD) or a substrate for an EL element or a solar cell. Furthermore, the parallel-plate type capacitively coupled plasma processing apparatus has been exemplified as a plasma processing apparatus, but the present disclosure is not limited thereto and can also be applied to an inductively coupled plasma (ICP) processing apparatus, a RLSA plasma processing apparatus, and a magnetron plasma processing apparatus.

INDUSTRIAL APPLICABILITY

The present disclosure can be applied a plasma processing method and a plasma processing apparatus of etching a multilayer film on a target substrate with plasma.

EXPLANATION OF REFERENCE NUMERALS

100: Plasma processing apparatus
110: Processing chamber
112: Mounting table
114: Cylindrical holding member
116: Cylindrical supporting member
118: Focus ring
120: Gas exhaust path
122: Baffle plate
124: Gas exhaust opening
126: Gas exhaust line
128: Gas exhaust unit
130: Gate valve
133, 134: Matching unit
138: Shower head
140: Electrostatic chuck
140a: Electrode
142: DC voltage supply
143: Switch
152: Heat transfer gas supply unit
154: Gas supply line
156: Electrode plate
156a: Gas discharge hole
158: Electrode supporting body
160: Buffer room
160a: Gas inlet opening
162: Processing gas supply unit
164: Gas supply line
182: Coolant line
184: Chiller unit
186, 188: Line
190: Heater
192: AC power supply
200: Control unit
210: Operation unit
220: Storage unit
310: Base silicon film
320: Multilayer film
330: Mask layer
340: Laminated film
350: Etching stopper film
AC: Active layer
W: Wafer

We claim:
1. A plasma processing method of performing a plasma etching process on a multilayer film formed on a target substrate arranged in a processing chamber with a patterned mask layer as a mask by generating plasma of a processing gas,
wherein the multilayer film includes a laminated film in which a first film and a second film having different relative permitivities are alternately formed on a base silicon film,
a main etching process of forming a recess portion in the laminated film to a predetermined depth and an over etching process of further forming the recess portion until the base silicon film is exposed are performed by introducing the processing gas including a fluorocarbon-based gas and an oxygen gas into the processing chamber to generate the plasma and by performing the plasma etching process,
in the over etching process, a first over etching process in which a ratio of a flow rate of the oxygen gas to a flow rate of the fluorocarbon-based gas is set to be increased as compared to the main etching process and a second over etching process in which the ratio of the flow rate of the oxygen gas to the flow rate of the fluorocarbon-based gas is set to be reduced as compared to the first over etching process are repeatedly performed two or more times, and
in the over etching process, a high frequency power for bias is pulse-modulated and applied in a pulse form to a mounting table configured to mount thereon the target substrate.
2. The plasma processing method of claim 1,
wherein the processing gas further includes a hydrofluoro carbon-based gas, and
in the second over etching process, a ratio of a flow rate of the hydrofluoro carbon-based gas in the processing gas is set to be zero or reduced as compared to the first over etching process.

3. The plasma processing method of claim 1,
wherein, in the second over etching process, the processing gas further includes any one or both of a $CF_4$ gas and a $NF_3$ gas.

4. The plasma processing method of claim 1,
wherein a number of times of repeating the first over etching process and the second over etching process is six or more.

5. The plasma processing method of claim 1,
wherein a processing condition for the second over etching process is the same as a processing condition for the main etching process.

6. The plasma processing method of claim 1,
wherein one of the first film and the second film constituting the laminated film is a silicon oxide film and the other is a silicon nitride film.

7. A plasma processing apparatus of performing a plasma etching process on a multilayer film formed on a target substrate with a patterned mask layer as a mask by generating plasma of a processing gas within a processing chamber, the plasma processing apparatus comprising:
   an upper electrode provided within the processing chamber;
   a lower electrode which is arranged to face the upper electrode and configured to mount thereon the target substrate on which the multilayer film including a laminated film, in which a first film and a second film having different relative permitivities are alternately formed on a base silicon film, is formed;
   a first high frequency power supply configured to apply a high frequency power for plasma generation to the lower electrode;
   a second high frequency power supply configured to apply a high frequency power for bias to the lower electrode; and
   a control unit configured to perform a main etching process of forming a recess portion in the laminated film to a predetermined depth and an over etching process of further forming the recess portion until the base silicon film is exposed by introducing the processing gas including a fluorocarbon-based gas and an oxygen gas into the processing chamber to generate the plasma and by performing the plasma etching process,
   wherein, in the over etching process, the control unit repeatedly performs a first over etching process in which a ratio of a flow rate of the oxygen gas to a flow rate of the fluorocarbon-based gas is set to be increased as compared to the main etching process and a second over etching process in which the ratio of the flow rate of the oxygen gas to the flow rate of the fluorocarbon-based gas is set to be reduced as compared to the first over etching process two or more times, and
   in the over etching process, the control unit is configured to pulse-modulate the high frequency power for bias and to apply the high frequency power for bias in a pulse form to the lower electrode.

8. A plasma processing method of performing a plasma etching process on a multilayer film formed on a target substrate arranged in a processing chamber with a patterned mask layer as a mask by generating plasma of a processing gas,
   wherein the multilayer film includes a laminated film in which a first film and a second film having different relative permitivities are alternately formed on a base film,
   a main etching process of forming a recess portion in the laminated film to a predetermined depth and an over etching process of further forming the recess portion until the base film is exposed are performed by introducing the processing gas including a first gas and a second gas into the processing chamber to generate the plasma and by performing the plasma etching process,
   in the over etching process, a first over etching process in which a ratio of a flow rate of the second gas to a flow rate of the first gas is set to be increased as compared to the main etching process and a second over etching process in which the ratio of the flow rate of the second gas to the flow rate of the first gas is set to be reduced as compared to the first over etching process are repeatedly performed two or more times,
   in the over etching process, a high frequency power for bias is pulse-modulated and applied in a pulse form to a mounting table configured to mount thereon the target substrate.

9. The plasma processing method of claim 8,
wherein, in the second over etching process, a ratio of a flow rate of the first gas in the processing gas is set to be zero or reduced as compared to the first over etching process.

10. The plasma processing method of claim 8,
wherein, in the second over etching process, the processing gas further includes a third gas.

11. The plasma processing method of claim 8,
wherein a number of times of repeating the first over etching process and the second over etching process is six or more.

12. The plasma processing method of claim 8,
wherein a processing condition for the second over etching process is the same as a processing condition for the main etching process.

* * * * *